United States Patent
Saito et al.

(10) Patent No.: US 6,881,631 B2
(45) Date of Patent: Apr. 19, 2005

(54) METHOD OF MANUFACTURING SEMICONDUCTOR DEVICE

(75) Inventors: Tomohiro Saito, Yokohama (JP); Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/700,561

(22) Filed: Nov. 5, 2003

(65) Prior Publication Data

US 2005/0048722 A1 Mar. 3, 2005

(30) Foreign Application Priority Data

Aug. 26, 2003 (JP) ........................................ 2003-301023

(51) Int. Cl.$^7$ .............................................. H01L 21/336
(52) U.S. Cl. ........................ 438/283; 438/157; 438/176
(58) Field of Search .................... 438/283, 157, 438/176, 199, 217, 218, 230, 231, 232, 233, 265, 275

(56) References Cited

U.S. PATENT DOCUMENTS

| | | | | |
|---|---|---|---|---|
| 4,814,854 A | * | 3/1989 | Tigelaar et al. | 257/382 |
| 5,512,771 A | * | 4/1996 | Hiroki et al. | 257/369 |
| 6,027,961 A | | 2/2000 | Maiti et al. | |
| 6,074,915 A | * | 6/2000 | Chen et al. | 438/258 |
| 6,111,619 A | * | 8/2000 | He et al. | 349/43 |
| 6,140,688 A | * | 10/2000 | Gardner et al. | 257/412 |
| 6,291,282 B1 | | 9/2001 | Wilk et al. | |
| 6,468,851 B1 | * | 10/2002 | Ang et al. | 438/216 |
| 6,475,908 B1 | * | 11/2002 | Lin et al. | 438/659 |
| 6,506,676 B1 | * | 1/2003 | Park et al. | 438/683 |
| 6,514,827 B1 | * | 2/2003 | Kim et al. | 438/292 |
| 6,524,904 B1 | * | 2/2003 | Segawa et al. | 438/232 |
| 6,528,371 B1 | * | 3/2003 | Kim | 438/283 |
| 6,528,401 B1 | * | 3/2003 | Bae et al. | 438/592 |
| 6,660,577 B1 | * | 12/2003 | Chen et al. | 438/199 |
| 6,677,652 B1 | * | 1/2004 | Lin et al. | 438/199 |
| 6,689,676 B1 | * | 2/2004 | Pham et al. | 438/587 |
| 6,693,333 B1 | * | 2/2004 | Yu | 257/407 |
| 6,696,328 B1 | * | 2/2004 | Rhee et al. | 438/199 |
| 6,706,581 B1 | * | 3/2004 | Hou et al. | 438/216 |
| 6,727,130 B1 | * | 4/2004 | Kim et al. | 438/199 |
| 6,730,572 B1 | * | 5/2004 | Lee et al. | 438/373 |
| 6,750,519 B1 | * | 6/2004 | Lin et al. | 257/407 |
| 6,750,532 B1 | * | 6/2004 | Rhee et al. | 257/657 |
| 6,784,060 B1 | * | 8/2004 | Ryoo | 438/275 |
| 6,790,719 B1 | * | 9/2004 | Adetutu et al. | 438/195 |
| 6,794,232 B1 | * | 9/2004 | Zheng et al. | 438/186 |
| 6,794,234 B1 | * | 9/2004 | Polishchuk et al. | 438/199 |
| 6,808,985 B1 | * | 10/2004 | Lee et al. | 438/257 |
| 6,815,285 B1 | * | 11/2004 | Choi et al. | 438/275 |

FOREIGN PATENT DOCUMENTS

| | | | | |
|---|---|---|---|---|
| JP | 08172139 A | * | 7/1996 | ....... H01L/21/8249 |
| JP | 08186259 A | * | 7/1996 | ......... H01L/21/265 |
| JP | 2002-198441 | | 7/2002 | |

* cited by examiner

*Primary Examiner*—John F. Niebling
*Assistant Examiner*—Walter L. Lindsay, Jr.
(74) *Attorney, Agent, or Firm*—Finnegan, Henderson, Farabow, Garrett & Dunner, L.L.P.

(57) ABSTRACT

A method of manufacturing a semiconductor device comprises forming a first conductive material film on a semiconductor substrate with a gate insulating film interposed therebetween, selectively forming a second conductive material film on the first conductive material film, the second conductive material film being capable of reducing the first conductive material film, causing that portion of the first conductive material film which is selectively covered with the second conductive material film to be subjected to a reducing reaction with the second conductive material film so as to change the composition of the resultant film and to form a third conductive material film differing in the work function from the first conductive material film, and forming a first gate electrode having the first conductive material film and a second gate electrode having at least the third conductive material film and differing from the first gate electrode in the work function.

19 Claims, 5 Drawing Sheets

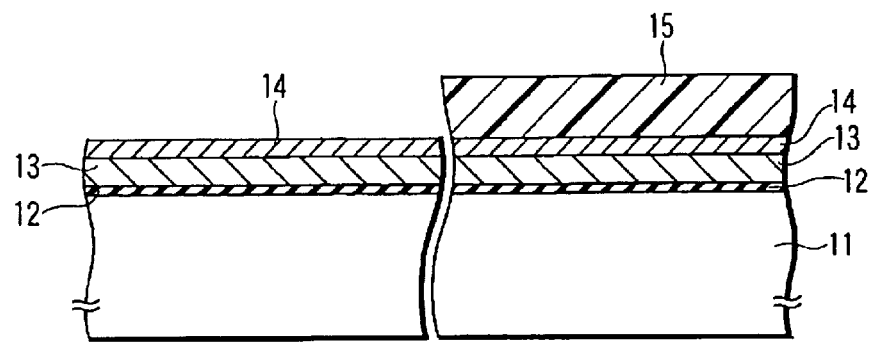
F I G. 2A
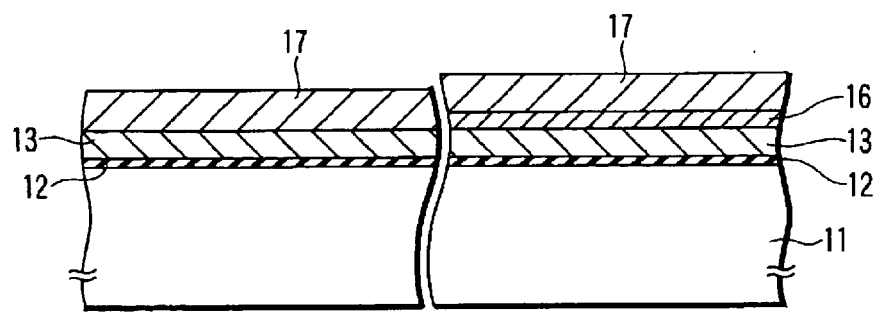
F I G. 2B
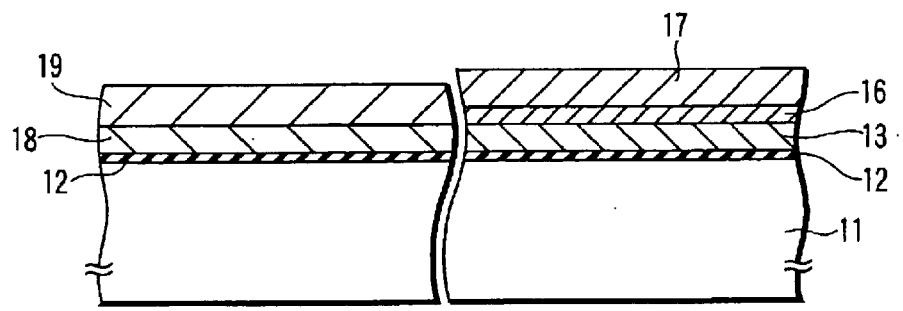
F I G. 2C
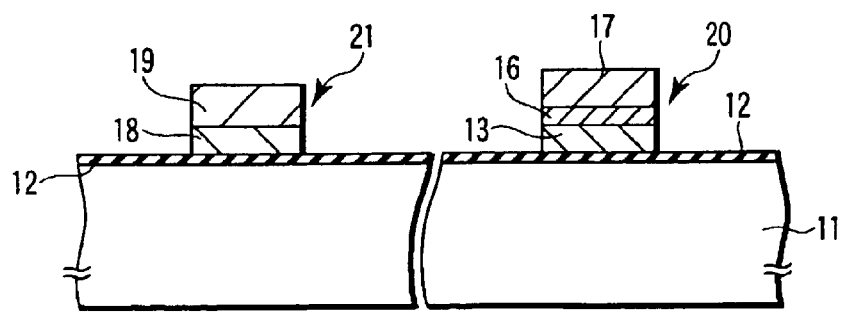
F I G. 2D

METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2003-301023, filed Aug. 26, 2003, the entire contents of which are incorporated herein by reference.

BACKGROUND OF THE INVENTION

1. Field of the Invention

The present invention relates to a method of manufacturing a semiconductor device, particularly, to a method of manufacturing a semiconductor device comprising gate electrodes of differing work functions.

2. Description of the Related Art

In recent years, it is has become of highest importance to lower the resistance of the gate electrode in accordance with the development of a MOSFET device of the sub-micron order. It was customary in the past to use a polycrystalline silicon (polysilicon) doped with an impurity for forming the gate electrode. However, a depletion layer is generated at the interface between the gate electrode formed of a polycrystalline silicon doped with an impurity and the gate insulating film. The generation of the depletion layer is substantially equal to an increase in the thickness of the gate insulating film so as to decrease the drive current of transistor. With progress in the miniaturization of the gate insulating film, the decrease of the drive current of transistor brings about a problem that cannot be neglected.

For suppressing the generation of the depletion layer in the gate electrode, it is effective to use a gate electrode made of a metal in place of a polycrystalline silicon. Also, the metal gate electrode has a work function corresponding to the mid band gap of silicon. Therefore, it is possible to use the metal gate electrode as a single gate electrode that permits forming symmetrical threshold voltages in, for example, the NMOS region and the PMOS region.

However, in the CMOS device comprising a metal gate electrode as, for example, a single gate electrode, the flat band voltage is decreased in each of the NMOS device region and the PMOS device region, which gives rise to the phenomenon that the threshold voltage is increased. For lowering the threshold voltage, it is possible to form a buried channel by means of a counter doping. In this case, however, the short channel effect of the MOSFET device is increased, which makes it impossible to achieve a fine device.

Such being the situation, it is proposed to form metal gates differing from each other in the work function in, for example, the NMOS region and the PMOS region of the CMOS structure. To be more specific, a method of forming a dual metal gate for a semiconductor device is disclosed in, for example, Japanese Patent Disclosure (Kokai) No. 2002-198441. The method for forming the dual metal gate disclosed in this prior art comprises preparing a semiconductor substrate including a PMOS region and an NMOS region and having a dummy gate formed in each of the PMOS region and the NMOS region, forming an interlayer insulating film on the semiconductor substrate in a manner to cover the dummy gates, polishing the interlayer insulating film until the dummy gates are exposed to the outside, forming a first trench defining a first metal gate by selectively removing any one of the dummy gates formed in the PMOS region and the NMOS region, successively forming a first gate insulating film and a first metal film on the entire region of the semiconductor substrate having the first trench formed therein, forming a first metal gate within the first trench by etching the first metal film and the first gate insulating film until the interlayer insulating film is exposed to the outside, forming a second trench defining a second metal gate region by removing the residual dummy gate, successively forming a second gate insulating film and a second metal film on the entire region of the semiconductor substrate having the second trench formed therein, and forming a second metal gate within the second trench by etching the second metal film and the second gate insulating film until the interlayer insulating film is exposed to the outside.

However, in the method disclosed in Japanese Patent Disclosure No. 2002-198441 quoted above, the first trench is formed by removing one dummy gate, followed by burying the first gate insulating film and the first metal gate in the first trench. Then, the second trench is formed by removing the residual dummy gate, followed by burying the second gate insulating film and the second metal gate in the second trench so as to form a dual metal gate. What should be noted is that, in this prior art, it is necessary to carry out twice the step of forming a gate insulating film so as to make the manufacturing process complex. What should also be noted is that, since the first metal gate is exposed to the outside in the step of forming the second gate insulating film, the reliability of the second gate insulating film is lowered. Further, if the second gate insulating film is formed under high temperatures not lower than 600° C., the exposed second metal gate tends to be deteriorated.

BRIEF SUMMARY OF THE INVENTION

According to a first aspect of the present invention, there is provided a method of manufacturing a semiconductor device, comprising:

forming a first conductive material film on a semiconductor substrate with a gate insulating film interposed therebetween;

selectively forming a second conductive material film on the first conductive material film, the second conductive material film being capable of reducing the first conductive material film;

causing that portion of the first conductive material film which is selectively covered with the second conductive material film to be subjected to a reducing reaction with the second conductive material film so as to change the composition of the resultant film and to form a third conductive material film differing in the work function from the first conductive material film; and forming a first gate electrode having the first conductive material film and a second gate electrode having at least the third conductive material film and differing from the first gate electrode in the work function.

Further, according to a second aspect of the present invention, there is provided a method of manufacturing a semiconductor device, comprising:

forming a first conductive material film on a semiconductor substrate with a gate insulating film interposed therebetween;

selectively forming a reaction inhibiting layer on the first conductive material film;

forming a second conductive material layer on the first conductive material film including the reaction inhibiting layer, the second conductive material film being capable of reducing the first conductive film;

causing that portion of the first conductive material film which is in direct contact with the second conductive material film to be subjected to a reducing reaction with the second conductive material film so as to change the composition of the resultant film and to form a third conductive material film differing in the work function from the first conductive material film; and forming a first gate electrode having at least the first conductive material film and a second gate electrode having at least the third conductive material film and differing from the first gate electrode in the work function.

BRIEF DESCRIPTION OF THE SEVERAL VIEWS OF THE DRAWING

FIGS. 2A to 2D are cross sectional views collectively showing a manufacturing process of a semiconductor device according to a second embodiment of the present invention;

DETAILED DESCRIPTION OF THE INVENTION

Some embodiments of the present invention will now be described with reference to the accompanying drawings.

(First Embodiment)

FIGS. 1A to 1D are cross sectional views collectively showing a manufacturing process of a semiconductor device according to a first embodiment of the present invention.

(First Step)

Figure 1A:
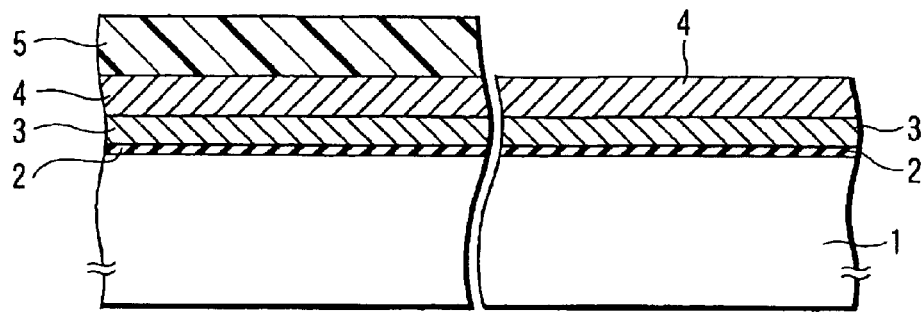
FIGS. 1A to 1D are cross sectional views collectively showing a manufacturing process of a semiconductor device according to a first embodiment of the present invention.
Figure 1B:
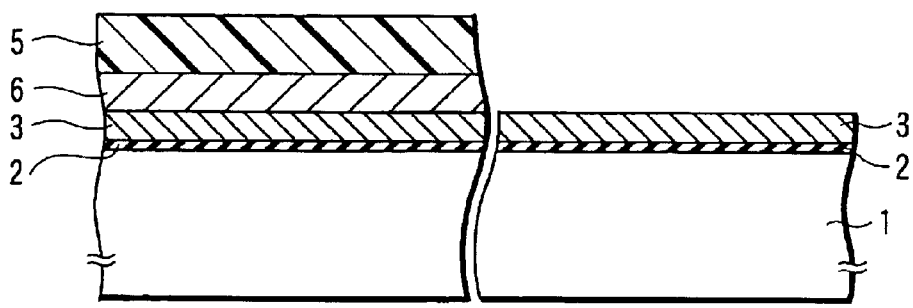

As shown in FIG. 1A, a gate insulating film 2 is formed on a semiconductor substrate 1, followed by forming a first conductive material film 3 on the gate insulating film 2. Further, a second conductive material film 4 capable of reducing the first conductive material film 3 is formed on the first conductive material film 3. After formation of the second conductive material film 4, a masking material, e.g., a resist pattern 5, is selectively formed on the second conductive material film 4. Further, the second conductive material film 4 is selectively removed by etching with the resist pattern 5 used as a mask so as to form a patterned second conductive material film 6 on the first conductive material layer 3, as shown in FIG. 1B.

In selecting the first and second conductive materials, it is desirable to pay attention to the difference in the free energy in the reducing reaction stage between these conductive materials. To be more specific, it is desirable for the first and second conductive materials to have the relationship specified in formula (1) given below in respect of a difference in the free energy in the reducing reaction stage:

$$\Delta G(M1N_x+M2) < \Delta G(M2N_x+M1) \quad (1)$$

where each of M1 and M2 denotes a metal, and each of $M1N_x$ and $M2N_x$ denotes a nitride.

In other words, it is desirable for the first conductive material to be $M1N_x$ and for the second conductive material to be M2. To be more specific, $WN_x$, where x falls within a range of between 0.5 and 2, i.e., $0.5 \leq x \leq 2$), is used as the first conductive material, and Ti is used as the second conductive material.

(Second Step)

Figure 1C:
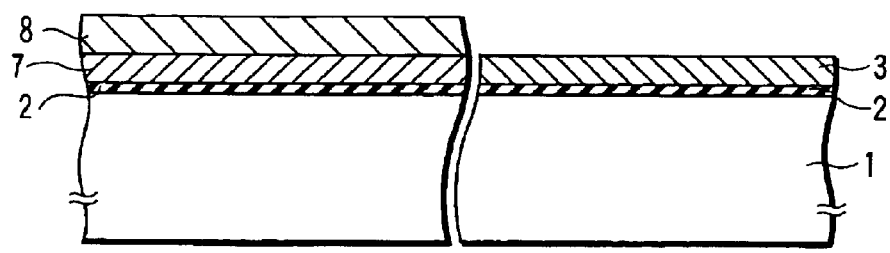

After the resist pattern 5 is removed, a heat treatment is applied at a temperature at which the reducing reaction can be performed. In this stage, a reducing reaction is carried out between the first conductive material film 3 and the second conductive material film 6 in that portion of the first conductive material film 3 which is covered with the patterned second conductive material film 6. As a result, the composition in that portion of the first conductive material film 3 which was covered with the patterned second conductive material film 6 is changed so as to form a third conductive material film 7 differing from the first conductive material film 3 in the work function, as shown in FIG. 1C. Also, the composition of the patterned second conductive material film 6 itself is also changed so as to form a patterned fourth conductive material film 8. To be more specific, where the first and second conductive materials are formed of $WN_x$ and Ti, respectively, N is released from the portion of the first conductive material film 3 formed of $WN_x$ so as to be converted into the third conductive material film 7 formed of W, and the released N is introduced into the patterned second conductive material film 6 formed of Ti so as to form the patterned fourth conductive material film 8 formed of $TiN_x$, as seen from the relationship defined by formula (1) given above.

It is desirable for the heat treatment noted above to be carried out at temperatures of 400 to 600° C. under an atmosphere of an inert gas such as Ar, Ne or $N_2$.

(Third Step)

Figure 1D:
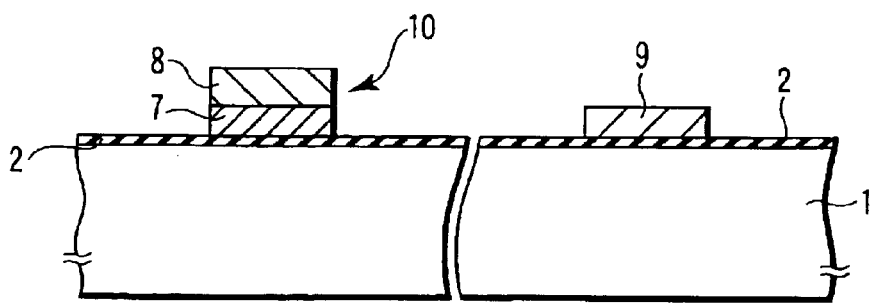

The first conductive material film 3 is patterned. Also patterned is a laminate structure consisting of the patterned fourth conductive material film 8 and the patterned third conductive material film 7. As a result, formed on the gate insulating film 2 are a first gate electrode 9 consisting of the first conductive material film 3 and a second gate electrode 10 consisting of the third conductive material film 7 and the fourth conductive material film 8 and differing from the first gate electrode 9 in the work function, as shown in FIG. 1D. The work function of the second gate electrode 10, which has a laminate structure, is determined by the third conductive material film, e.g., the W film, in contact with the gate insulating film 2.

Incidentally, for the patterning for forming the first and second gate electrodes noted above, it is possible to employ any of the methods given below in addition to the method described above:

(1) After the fourth conductive material film 8 positioned on the third conductive material film 7 is removed, each of the first conductive material film 3 and the third conductive material film 7 is patterned so as to form the first and second gate electrodes.

(2) After the fourth conductive material film 8 positioned on the third conductive material film 7 is removed, another conductive material film (fifth conductive material film) such as a W film is deposited on the entire surface, and each of the first conductive material film 3 and the third conductive material film 7 having the fifth conductive material film laminated thereon is patterned so as to form each of the first and second gate electrodes of the laminate structure.

As described above, according to the first embodiment of the present invention, it is possible to manufacture a semiconductor device comprising gate electrodes 9 and 10 formed of conductive materials differing from each other in the work function, e.g., the first gate electrode 9 consisting of $WN_x$ and the second gate electrode 10 including a W film positioned on the side of the gate insulating film 2.

It should also be noted that, in the first embodiment of the present invention, it is possible to form the gate insulating film 2 positioned below the first and second gate electrodes 9 and 10 differing from each other in the work function by a single film-forming process. In the conventional method, however, a gate insulating film is formed every time each of the first and second metal gates differing from each other in the work function is formed. In other words, it is necessary to carry out twice the process of forming the gate insulating film in the conventional method. It follows that the first embodiment of the present invention permits simplifying the manufacturing process of the semiconductor device and also permits the mass production of the semiconductor device, compared with the conventional method.

Further, the first and second gate electrodes 9 and 10 differing from each other in the work function are formed after formation of the gate insulating film 2 in the first embodiment of the present invention. It follows that, even if the gate insulating film 2 is formed at a high temperature not lower than, for example, 600° C., it is possible to avoid the thermal influence given to the gate electrodes 9 and 10 in the process of forming the gate insulating film 2. Such being the situation, it is possible to manufacture a semiconductor device having a high reliability.

(Second Embodiment)

FIGS. 2A to 2D are cross sectional views collectively showing the manufacturing process of a semiconductor device according to a second embodiment of the present invention.

(First Step)

A gate insulating film 12 is formed on a semiconductor substrate 11, followed by depositing a first conductive material film 13 on the gate insulating film 12, as shown in FIG. 2A. Then, a reaction inhibiting layer 14 is deposited on the entire surface, followed by selectively forming a masking material, e.g., a resist pattern 15, on the reaction inhibiting layer 14. After formation of the resist pattern 15, the reaction inhibiting layer 14 is selectively removed by etching with the resist pattern 15 used as a mask so as to form a patterned reaction inhibiting layer 16 on the first conductive material film 13. Then, the resist pattern is removed, followed by depositing on the entire surface a second conductive material film 17 capable of reducing the first conductive material film 13, as shown in FIG. 2B.

The conductive materials satisfying the relationship defined in formula (1) given previously are used as the first and second conductive materials in the second embodiment of the present invention, too. To be more specific, $WN_x$, in which x falls within a range of between 0.5 and 2, i.e., $0.5 \leq x \leq 2$, can be used as the first conductive material, and Ti can be used as the second conductive material.

The reaction inhibiting layer is formed in a desired region of the first conductive material film so as to avoid the direct contact between the first conductive material film 13 and the second conductive material film 17 in the particular region of the first conductive material film, thereby inhibiting the reducing reaction between the first conductive material film 13 and the second conductive material film 17. The reaction inhibiting layer is formed of, for example, a silicon oxide film or a carbon film.

(Second Step)

A heat treatment is applied at a temperature at which the reduction can be achieved. In this stage, a reducing reaction is carried out between the first conductive material film 13 and the second conductive material film 17 in that portion of the first conductive material film 13 which is in direct contact with the second conductive material film 17, i.e., the portion where the patterned reaction inhibiting layer 16 is not interposed between the first conductive material film 13 and the second conductive material film 17. As a result, the composition in that portion of the first conductive material film 13 which is in direct contact with the second conductive material film 17 is changed so as to form a third conductive material film 18 differing in the work function from the first conductive material film 3. Also, the composition of the second conductive material film 17 itself corresponding to the particular portion of the first conductive material film 13 is changed so as to form a patterned fourth conductive material film 19, as shown in FIG. 2C. To be more specific, where the first and second conductive materials are formed of $WN_x$ and Ti, respectively, N is released from the portion of the first conductive material film 13 formed of $WN_x$ so as to be converted into a third conductive material film 18 formed of W, and the released N is introduced into that portion of the second conductive material film 17 formed of Ti which corresponds to the first conductive material film 13 so as to form a fourth conductive material film 19 formed of $TiN_x$, as seen from the relationship defined by formula (1) given above.

It is desirable for the heat treatment noted above to be carried out at temperatures of 450 to 600° C. under an atmosphere of an inert gas such as Ar, Ne or $N_2$.

(Third Step)

Each of the first conductive material film 13, the patterned reaction inhibiting layer 16 and the second conductive material film 17, which are laminated one upon the other, the fourth conductive material film 19 and the third conductive material film 18, which are also laminated one upon the other, is patterned so as to form on the gate insulating film 12 a first gate electrode 20, which consists of the first conductive material film 13, the patterned reaction inhibiting layer 16 and the second conductive material film 17, and a second gate electrode 21, which consists of the third conductive material film 18 and the fourth conductive material film 19 and differs from the first gate electrode 20 in the work function, as shown in FIG. 2D. The work functions of the first gate electrode 20 and the second gate electrode 21 each having a laminate structure are determined by the first conductive material film 13, e.g., a $WN_x$ film, and the third conductive material film, e.g., a W film, which are in direct contact with the gate insulating film 12.

Incidentally, it is acceptable to employ any of the methods given below in addition to the method described above for the patterning for forming the first and second gate electrodes:

(1) The patterned reaction inhibiting layer 16 and the second conductive material film 17 on the first conductive material film 12 are removed and, at the same time, the fourth conductive material film 19 on the third conductive material film 18 is removed, followed by patterning the first conductive material film 13 and the third conductive material film 16 so as to form the first and second gate electrodes, respectively.

(2) The patterned reaction inhibiting layer 16 and the second conductive material film 17 on the first conductive material film 12 are removed and, at the same time, the fourth conductive material film 19 on the third conductive material film 18 is removed, followed by depositing on the entire surface another conductive material (fifth conductive material film) such as a W film. Then, each of the first conductive material film 13 having the fifth conductive material film laminated thereon and the third conductive material film having the fifth conductive material film laminated thereon is patterned so as to form the first and second gate electrodes.

As described above, according to the second embodiment of the present invention, it is possible to manufacture a semiconductor device comprising the gate electrodes 20 and 21 formed of conductive materials differing from each other in the work function, e.g., the first gate electrode 20 including a $WN_x$ film in direct contact with the gate insulating film 12 and the second gate electrode 21 including a W film in direct contact with the gate insulating film 12.

It should also be noted that, in the second embodiment of the present invention, the gate insulating film 12 positioned below the first and second gate electrodes 20 and 21 differing from each other in the work function can be formed by a single film-forming process step. It follows that the second embodiment of the present invention permits simplifying the manufacturing process of the semiconductor device and also permits the mass production of the semiconductor device, compared with the prior art in which a gate insulating film is formed every time each of the first and second metal gates differing from each other in the work function is formed, i.e., the prior art in which the process of forming the gate insulating film is required to be carried out twice.

Further, the first and second gate electrodes 20 and 21 differing from each other in the work function are formed after formation of the gate insulating film 12 in the second embodiment of the present invention. It follows that, even if the gate insulating film 12 is formed at a high temperature not lower than, for example, 600° C., it is possible to avoid the thermal influence given to the first and second gate electrodes 20 and 21 in the process of forming the gate insulating film 12. Such being the situation, it is possible to manufacture a semiconductor device having a high reliability.

Some Examples of the present invention will now be described with reference to the accompanying drawings.

EXAMPLE 1

Figure 3A:
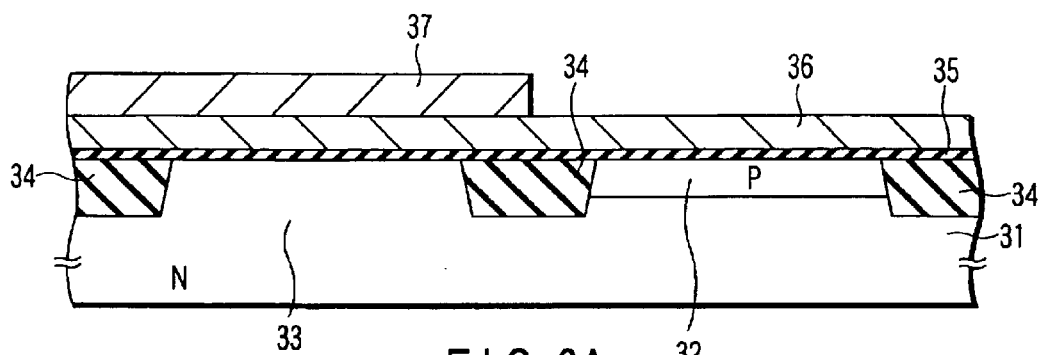
FIGS. 3A to 3D are cross sectional views collectively showing a manufacturing process of a complementary semiconductor device for Example 1 of the present invention.

In the first step, a buffer oxide film (not shown) and a silicon nitride film (not shown) were formed on an N-type semiconductor substrate (e.g., an N-type silicon wafer) 31, followed by forming a resist pattern on the silicon nitride film and subsequently etching selectively the silicon nitride film with the resist pattern used as a mask so as to form a silicon nitride film pattern in the element region of the buffer oxide film, as shown in FIG. 3A. Then, the buffer oxide film and the silicon wafer 31 were selectively etched by a reactive ion etching with the silicon nitride film pattern used as a mask so as to form trenches. After formation of the trenches, a silicon oxide film was deposited on the entire surface, followed by applying a CMP (Chemical Mechanical Polishing) treatment to the deposited silicon oxide film so as to planarize the silicon oxide film such that the surface of the planarized silicon oxide film was lowered to reach the upper surface of the silicon nitride film pattern. Then, the silicon nitride film pattern and the buffer oxide film were removed so as to form a shallow trench type element isolating (STI) region 34 for separating a first element region 32 from a second element region 33 as viewed from the right side in FIG. 3A. After formation of the STI region 34, a P-type impurity, e.g., boron, was introduced by means of an ion implantation into the first element region 32, followed by activating the implanted boron atoms so as to form a P Well, i.e., NMOS region. Incidentally, the second element region 33 is formed into an N Well, i.e., PMOS region. Also, a P-type impurity, e.g., boron, or an N-type impurity, e.g., arsenic, for the channel control is introduced by means of an ion implantation into each of the element regions 32 and 33 of the silicon wafer 31, as required, followed by an annealing treatment for activating the implanted impurity ions, thereby controlling the impurity concentration in each of the element regions 32 and 33. Then, the buffer oxide film was removed, followed by forming a gate oxide film 35 consisting of $Ta_2O_5$ by a CVD method on the element regions 32 and 33 formed in the silicon wafer 31. The gate insulating film 35 had a thickness of, for example, 4 to 8 nm. Incidentally, in order to prevent the reaction between Ta and silicon in each of the element regions 32 and 33, it is desirable to apply a nitriding treatment to the silicon surface in, for example, each of the element regions so as to form an interfacial layer prior to formation of the gate insulating film. It is acceptable to carry out, as required, a post annealing treatment for improving the film quality after formation of the gate insulating film. Then, a tungsten nitride ($WN_x$) film 36 was deposited by a CVD method on the entire surface in a thickness of, for example, 10 nm, followed by depositing a Ti film on the entire surface by a CVD method in a thickness of, for example, 10 to 50 nm. Further, a masking material, e.g., a resist pattern, was formed on the Ti film, followed by patterning the Ti film with the resist pattern used as a mask so as to form a patterned Ti film 37 on the $WN_x$ film 36 on the side of the PMOS region 33.

Figure 3B:
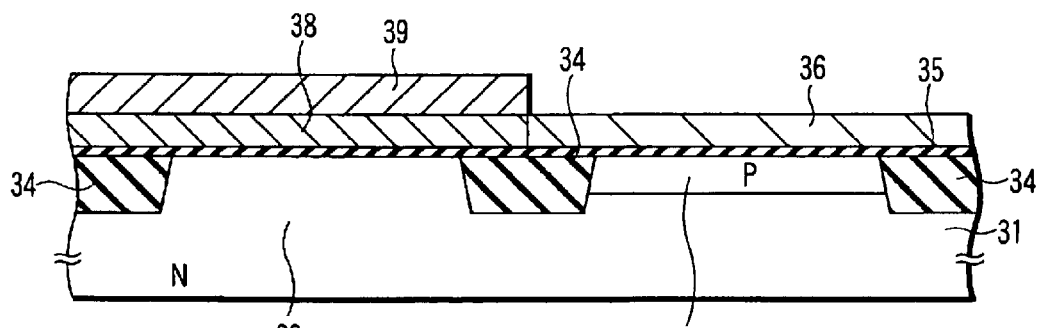

In the next step, the resist pattern was removed, followed by applying a heat treatment at 600° C. for about 30 minutes under an inert gas atmosphere. During the heat treatment, N was released from $WN_x$ in that portion of the $WN_x$ film 36 which was in contact with the patterned Ti film 37 so as to form a W film 38, as shown in FIG. 3B. In other words, the $WN_x$ film 36 was formed on that portion of the gate insulating film 35 which was positioned in the NMOS region 32, and the W film 38 differing from the $WN_x$ film 36 in the work function was formed on that portion of the gate insulating film 35 which was positioned in the PMOS region 33. Incidentally, the patterned Ti film 37 was nitrided so as to be changed into a $TiN_x$ film 39.

Figure 3C:
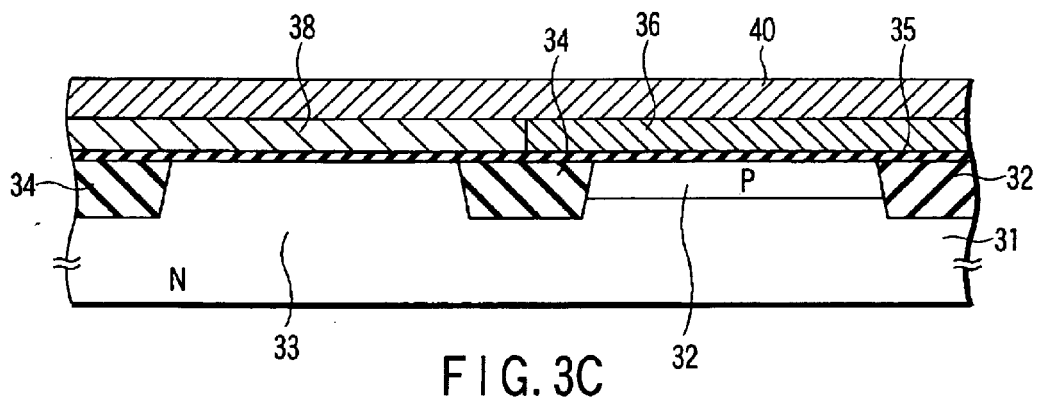
Figure 3D:
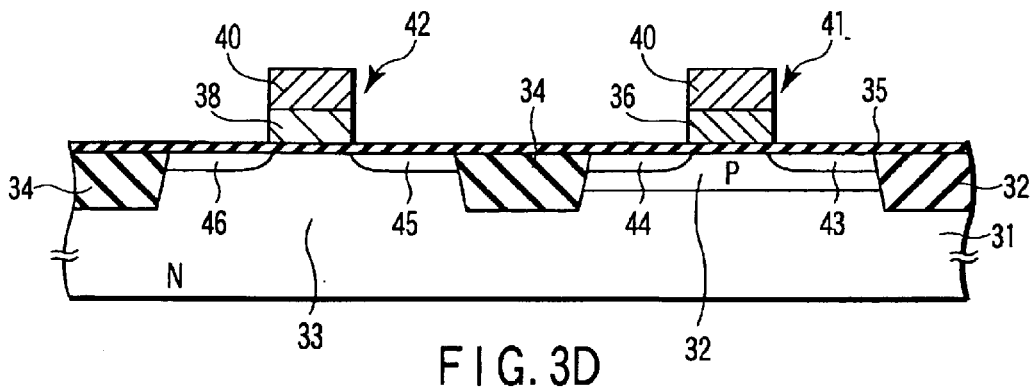

In the next step, the $TiN_x$ film 39 was removed, followed by depositing a tungsten (W) film 40 on the entire surface by a sputtering method in a thickness of 250 nm, as shown in FIG. 3C. Then, resist patterns (not shown) shaped like gate electrodes were formed on those portions of the W film 40 which were positioned in the element regions 32 and 33, respectively, followed by selectively removing by an anisotropic etching such as a reactive ion etching (RIE) the $WN_x$ film 36, the W film 40 and the W films 38 and 40 with the resist patterns used as a mask, thereby forming a first gate electrode 41 consisting of the $WN_x$ film 36 and the W film 40 on the gate insulating film 35 in the NMOS region 32. At the same time, a second gate electrode 42 consisting of the W films 38 and 40 was formed on the gate insulating film 35 in the PMOS region 33. Incidentally, the first and second gate electrodes 41 and 42 were in contact with each other at one edge side and connected to each other by the W film 40 forming the upper layer of each of the first and second gate electrodes 41, 42.

In the next step, the resist pattern was removed, followed by forming again a resist pattern (not shown) in the PMOS region 33. Then, an N-type impurity, e.g., arsenic, was introduced into the NMOS region 32 by means of an ion implantation with the resist pattern and the first gate electrode 41 collectively used as a mask, followed by an activating heat treatment so as to form N-type source and drain diffusion layers 43 and 44. Further, the resist pattern was removed, followed by forming again a resist pattern (not shown) in the NMOS region 32. Then, a P-type impurity, e.g., boron, was introduced into the PMOS region 33 with the resist pattern and the second gate electrode 42 collectively used as a mask, followed by an activating heat treatment so as to form P-type source and drain diffusion layers 45 and 46.

In the next step, an interlayer insulating film (not shown) such as a silicon oxide film was deposited on the entire surface, followed by forming contact holes in those portions of the interlayer insulating film which corresponded to the N-type source and drain diffusion layers 43, 44 and the P-type source and drain diffusion layers 45, 46. Then, a laminate structure of Ti/TiN was deposited on the silicon wafer exposed to the outside through the contact holes, followed by applying an annealing treatment so as to permit the laminate structure noted above to react with the silicon wafer, thereby forming a silicide and, thus, lowering the contact resistance. Further, an Al film was deposited and patterned so as to form on the interlayer insulating film a wiring connected to the N-type source and drain diffusion layers and the P-type source and drain diffusion layers through the contact holes. As a result, manufactured was a complementary MOS semiconductor device (CMOS device) comprising an NMOS device including the first gate electrode 41 containing $WN_x$ as the main component and a PMOS device including the second gate electrode 42 containing W as the main component.

According to Example 1 described above, it is possible to form on a single chip the NMOS device comprising the first gate electrode 41 containing tungsten nitride ($WN_x$) as the main component and the PMOS device comprising the second gate electrode 42 containing tungsten (W) as the main component. As a result, it was possible to manufacture a CMOS device of a high performance having a low threshold value without the performance degradation such as the Short Channel Effect.

It should also be noted that, in Example 1 described above, the gate insulating film 35 positioned below the first and second gate electrodes 41 and 42 differing from each other in the work function can be formed by a single film-forming process step. It follows that Example 1 permits the mass production of the CMOS device, compared with the prior art in which a gate insulating film is formed every time each of the first and second metal gates differing from each other in the work function is formed, i.e., the prior art in which the process of forming the gate insulating film is required to be carried out twice.

EXAMPLE 2

In Example 1 described above, the process of forming the $WN_x$ film 36 and the W film 38 differing from the $WN_x$ film 36 in the work function on the gate insulating film 35 positioned in the NMOS region 32 and the PMOS region 33 was performed by forming the patterned Ti film 37 on the tungsten nitride ($WN_x$) film 36 on the side of the PMOS region 33 and applying a desired heat treatment to the patterned Ti film 37.

On the other hand, in Example 2, it was possible to form the $WN_x$ film 36 and the W film 38 differing from the $WN_x$ film 36 in the work function on the gate insulating film 35 positioned on the NMOS region 32 and the PMOS region 33 by forming a reaction inhibiting layer such as a silicon oxide film or a carbon film on the tungsten nitride ($WN_x$) film 36 on the side of the NMOS region 32 and by depositing a Ti film on the entire surface, followed by applying a heat treatment similar to that in Example 1.

EXAMPLE 3

In the first step, a shallow trench type element isolating (STI) region 54 for separating a first element region 52 from a second element region 53 as viewed from the right side was formed in an N-type semiconductor substrate (e.g., an N-type silicon wafer) 51 by a method similar to that employed in Example 1. Then, a P-type impurity, e.g., boron, was introduced into the first element region 52 by means of an ion implantation, followed by applying an activating heat treatment so as to form a P Well, i.e., NMOS region. Incidentally, the second element region 53 forms an N Well, i.e., PMOS region. In the next step, a P-type impurity, e.g., boron, or an N-type impurity, e.g., arsenic, for the channel control, is introduced as required into each of the element regions 52 and 53 of the silicon wafer 51 by means of an ion implantation, followed by applying an activating heat treatment so as to control the impurity concentration in each of the element regions 52 and 53. Incidentally, the channel ion implantation is carried out in general before formation of the gate electrode. However, it is not absolutely necessary to carry out the channel ion implantation in this stage in the damascene gate process because the channel ion implantation can be performed after formation of a gate trench referred to herein later. Then, a polycrystalline silicon film having a thickness of 200 nm and a silicon nitride film having a thickness of 40 nm were successively deposited on the entire surface by a CVD method with the buffer oxide film left unremoved. After formation of the polycrystalline silicon film and the silicon nitride film, a resist pattern (not shown) was formed on the silicon nitride film, followed by etching the silicon nitride film and the polycrystalline silicon film by an anisotropic etching such as a RIE so as to form first and second dummy gates 57 and 58 each having a laminate structure consisting of a polycrystalline silicon film 55 and a silicon nitride film 56 in the element regions 52 and 53, respectively. After the resist pattern was removed, a resist pattern (not shown) was formed again in the PMOS region 53. Then, an N-type impurity, e.g., arsenic, was introduced into the NMOS region 52 by means of an ion implantation with the resist pattern thus formed and the first dummy gate 57 collectively used as a mask, followed by an activating heat treatment so as to form N-type source and drain diffusion layers 59 and 60 of a low impurity concentration. Further, after the resist pattern was removed, a resist pattern (not shown) was formed again in the NMOS region 52. Then, a P-type impurity, e.g., boron, was introduced into the PMOS region 53 by means of an ion implantation with the resist pattern thus formed and the second dummy gate 58 collectively used as a mask, followed by an activating heat treatment so as to form P-type source and drain diffusion layers 61 and 62 of a low impurity concentration.

Figure 4A:
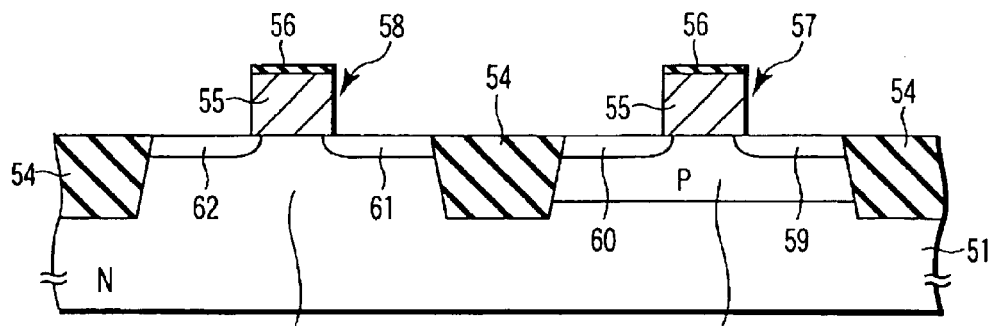
FIGS. 4A to 4H are cross sectional views collectively showing a manufacturing process of a complementary semiconductor device for Example 3 of the present invention.
Figure 4B:
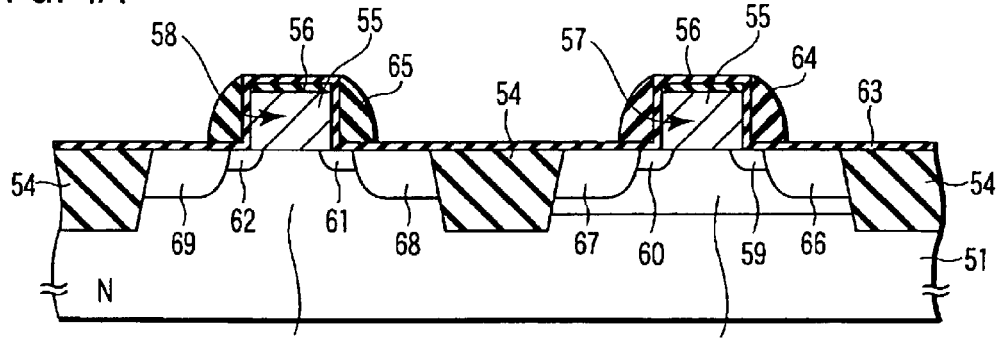

In the next step, a silicon nitride film 63 having a thickness of 20 nm and a silicon oxide film having a thickness of 70 nm were successively deposited on the silicon wafer 51 including the first and second dummy gates 57 and 58, followed by applying an anisotropic etching such as a RIE to the silicon oxide film. In this stage, side walls 64 and 65 each consisting of silicon oxide were formed on the side surfaces of the first and second dummy gates 57 and 58, respectively, as shown in FIG. 4B. Then, a resist pattern (not shown) was formed in the PMOS region 53, and an N-type impurity, e.g., arsenic, was introduced into the NMOS region 52 with the resist pattern thus formed, the first dummy gate 57 and the side wall 64 collectively used as a mask, followed by an activating heat treatment so as to form N-type source and drain diffusion layers 66 and 67 each having a high impurity concentration. After formation of the source and drain diffusion layers 66 and 67, the resist pattern was removed, and a new resist pattern (not shown) was formed again in the NMOS region 52. Then, a P-type impurity such as boron was introduced into the PMOS region 53 by means of an ion implantation with the new resist pattern thus formed, the second dummy gate 58 and the side wall 65 collectively used as a mask, followed by an activating heat treatment so as to form P-type source and drain diffusion layers 68 and 69 having a high impurity concentration. By the process described above, source and drain regions of an LDD structure were formed in the NMOS region 52 and the PMOS region 53. Incidentally, it is acceptable in the manufacturing method of the present invention to form silicides of Ti, Co, etc. in the source and drain regions so as to lower the resistance of the source and drain regions.

Figure 4C:
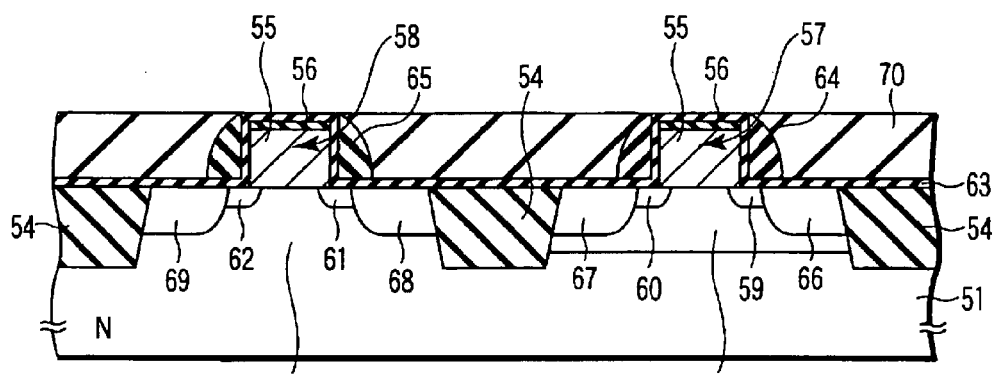
Figure 4D:
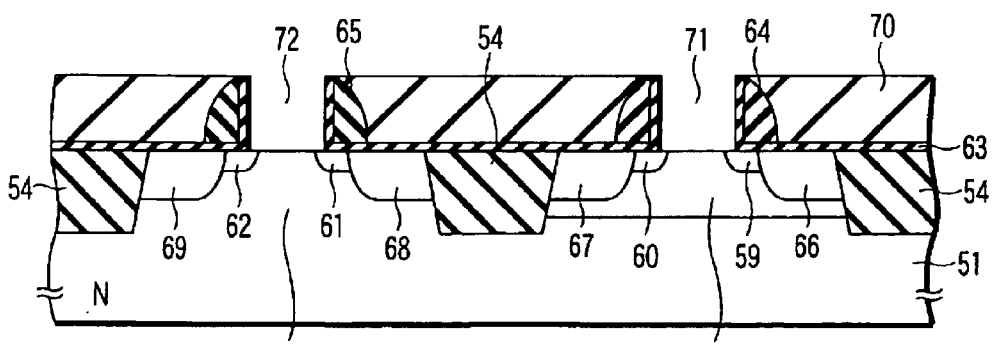

In the next step, a silicon oxide film was deposited in a thickness of, for example, 300 nm on the entire surface of the silicon wafer 51 including the first and second dummy gates 57 and 58, followed by applying a CMP treatment to the silicon oxide film until those portions of the silicon nitride film 63 which were positioned on the upper surfaces of the dummy gates 57 and 58 were exposed to the outside so as to form an interlayer insulating film 70 of a single layer structure having a flat upper surface, as shown in FIG. 4C. Then, the silicon nitride film 63 exposed to the outside on the dummy gates 57 and 58 and the silicon nitride film 56 constituting the dummy gates 57 and 58 were removed by the treatment with a hot phosphoric acid. Also, the polycrystalline silicon film 55 was removed by a chemical dry etching (CDE), and the buffer oxide film (not shown) was removed by the etching with a dilute hydrofluoric acid so as to remove the dummy gates 57 and 58, thereby forming a first gate trench 71 in the NMOS region 52 and a second gate trench 72 in the PMOS region 53 as shown in FIG. 4D. Where the ion implantation for controlling the impurity concentration in the channel portion is not performed before formation of the dummy gates, it is possible to introduce the impurity into the channel region in this stage.

Figure 4E:
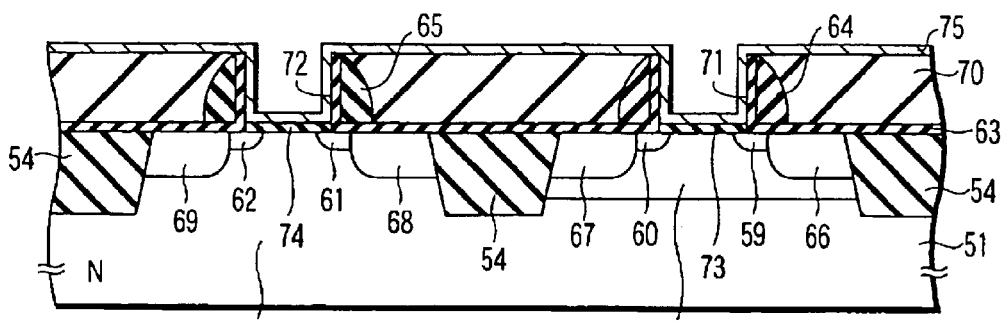

In the next step, gate insulating films 73 and 74 each formed of silicon oxide were formed in the NMOS region 52 and the PMOS region 53 exposed to the bottom surfaces of the gate trenches 71 and 72, respectively. Then, a tungsten nitride ($WN_x$) film 75 was deposited in a thickness of 10 nm on a first layer interlayer insulating film 70 including the inner regions of the gate trenches 71 and 72, as shown in FIG. 4E. It should be noted that the tungsten nitride ($WN_x$) film 75 simply serves to determine the threshold voltage of the transistor that is to be formed and, thus, it is not absolutely necessary to increase the thickness of the tungsten nitride film 75.

Figure 4F:
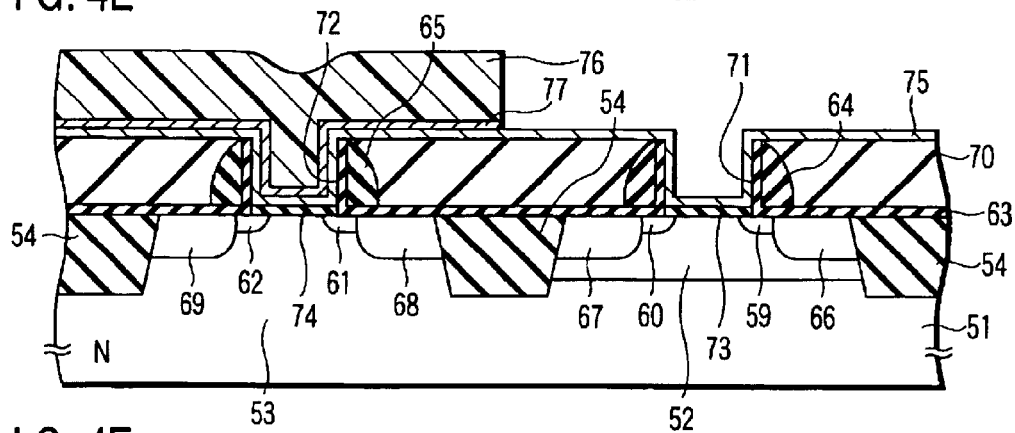

In the next step, a Ti film was deposited in a thickness of 10 to 50 nm on the tungsten nitride ($WN_x$) film 75. Then, a masking material such as a resist pattern 76 was formed on the Ti film, followed by patterning the Ti film by the etching with a Cl-based etchant, with the resist pattern 76 used as a mask, so as to form a patterned Ti film 77 on the $WN_x$ film 75 on the side of the PMOS region 53, as shown in FIG. 4F.

Figure 4G:
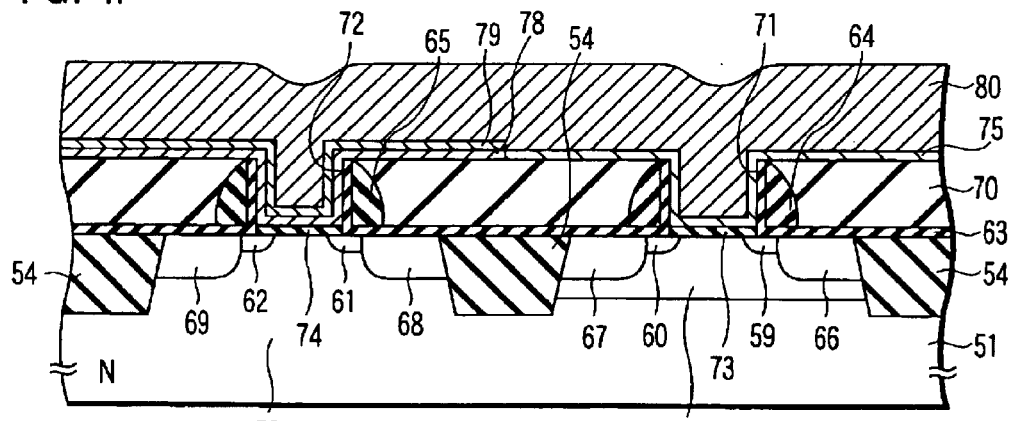

After formation of the patterned Ti film 77, the resist pattern was removed and, then, a heat treatment was applied at 600° C. for about 30 minutes under, for example, an Ar gas atmosphere. In this stage, N was released from $WN_x$ in that portion of the $WN_x$ film 75 which was in contact with the patterned Ti film 77 so as to form a W film 78. In other words, the $WN_x$ film 75 was formed on the gate insulating film 73 positioned in the NMOS region 52, and the W film 78 differing from the $WN_x$ film 75 in the work function was formed on the gate insulating film 74 positioned in the PMOS region 53. Incidentally, the patterned Ti film 76 was nitrided so as to be changed into a $TiN_x$ film 79. Then, a tungsten (W) film 80 used as a gate electrode material for forming the upper layer of the gate electrode was deposited in a thickness of 250 nm on the entire surface, as shown in FIG. 4G. Since the work function of the gate electrode is determined by the gate electrode material used for forming the lower layer of the gate electrode, the work function of the gate electrode is not affected by the work function of the gate electrode material for forming the upper layer of the gate electrode.

Figure 4H:
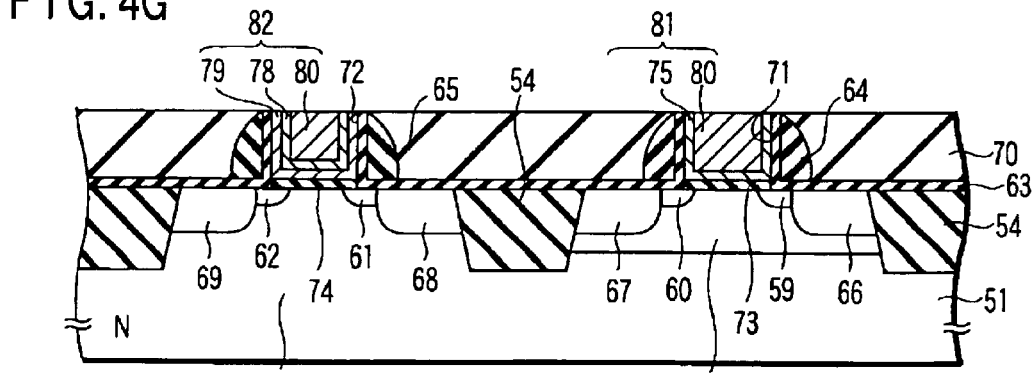

In the next step, a CMP treatment was applied to each of the W film 80, the $WN_x$ film 75 on the first layer interlayer insulating film 70, the W film 78 and the $TiN_x$ film 79 so as to bury a first gate 81 consisting of the $WN_x$ film 75 and the W film 80 in the first gate trench 71 such that the upper surface of the first gate 81 was rendered flush with the upper surface of the first layer interlayer insulating film 70. Likewise, a second gate electrode 82 consisting of the W film 78, the $TiN_x$ film 79 and the W film 80 was buried in the second gate trench 72 such that the upper surface of the second gate electrode 82 was rendered flush with the upper surface of the interlayer insulating film 70, as shown in FIG. 4H. Incidentally, the first and second gate electrodes 81 and 82 were in contact with each other at one edge side and connected to each other by the W film 80.

In the next step, a second layer interlayer insulating film (not shown) such as a silicon oxide film was deposited on the entire surface, followed by forming contact holes by an anisotropic etching in those portions of the second layer interlayer insulating film which corresponded to the first and second gate electrodes and the source and drain regions. Then, a Ti/TiN laminate structure was deposited on those portions of the silicon wafer which were exposed to the outside through the contact holes, followed by annealing the Ti/TiN laminate structure so as to cause the laminate structure to react with the silicon wafer. As a result, silicides were formed so as to lower the contact resistance. Further, an Al film was deposited and patterned so as to form a wiring connected to the source and drain diffusion layers through the contact holes. The wiring was formed on the second layer interlayer insulating film, thereby manufacturing a complementary MOS semiconductor device (CMOS) comprising the NMOS device including the first gate electrode 81 containing $WN_x$ as the main component and the PMOS device including the second gate electrode 82 containing W as the main component.

According to Example 3 described above, it was possible to form in a single chip the NMOS device having the first gate electrode 81 buried therein and the PMOS device having the second gate electrode 82 buried therein. As pointed out previously, the first gate electrode 81 contained tungsten nitride ($WN_x$) as the main component and the second gate electrode 82 contained tungsten (W), which differs from the tungsten nitride ($WN_x$) in the work function, as the main component. As a result, it was possible to manufacture a CMOS device having a low threshold value, a high performance.

It should also be noted that, in Example 3 described above, the gate insulating films 73 and 74 positioned below the first and second gate electrodes 81 and 82, respectively, differing from each other in the work function can be formed by a single film-forming process step. It follows that Example 3 permits the mass production of the CMOS device, compared with the prior art in which a gate insulating film is formed every time each of the first and second metal gates differing from each other in the work function is formed, i.e., the prior art in which the process of forming the gate insulating film is required to be carried out twice.

EXAMPLE 4

In Example 3 described above, the process step for forming the $WN_x$ film 75 on the gate insulating film 73 positioned in the NMOS region 52 and for forming the W film 78 differing from the $WN_x$ film 75 in the work function on the gate insulating film 74 positioned in the PMOS region 53 was performed by forming the patterned Ti film 77 on the tungsten nitride ($WN_x$) film 75 on the side of the PMOS region 53, followed by applying a desired heat treatment to the patterned Ti film 77.

On the other hand, in Example 4, a reaction inhibiting layer such as a silicon oxide film or a carbon film is formed on the tungsten nitride ($WN_x$) film 75 on the side of the NMOS region 52, followed by depositing a Ti film on the entire surface. Then, a heat treatment is applied as in Example 3 so as to form a $WN_x$ film 75 and a W film 78 differing from the $WN_x$ film 75 in the work function on the gate insulating films 73 and 74 positioned in the NMOS region 52 and the PMOS region 53, respectively.

Incidentally, the present invention is not limited to the embodiments described above. In other words, it is possible to modify the present invention in various fashions within the technical scope of the present invention.

Particularly, when it comes to the combination of the gate electrode materials, the gate electrode materials are not limited to the combination of W and TiN.

Also, the gate insulating film is not limited to a film of $Ta_2O_5$. It is also possible to use, for example, a silicon oxide film, a silicon nitride film, or a film of a silicate between a material having a high dielectric constant and silicon.

Further, the reaction inhibiting film is not limited to a carbon film and a silicon oxide film in the present invention. It is also possible to use a film of any substance capable of inhibiting the thermal reaction.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

forming a first conductive material film on a semiconductor substrate with a gate insulating film interposed therebetween;

selectively forming a second conductive material film on the first conductive material film, the second conductive material film being capable of reducing the first conductive material film;

causing that portion of the first conductive material film which is selectively covered with the second conductive material film to be subjected to a reducing reaction with the second conductive material film so as to change the composition of the resultant film and to form a third conductive material film differing in the work function from the first conductive material film; and forming a first gate electrode having the first conductive material film and a second gate electrode having at least the third conductive material film and differing from the first gate electrode in the work function.

2. The method of manufacturing a semiconductor device according to claim 1, wherein the gate insulating film is formed of a metal oxide film or a silicate film.

3. The method of manufacturing a semiconductor device according to claim 1, wherein the first conductive material film is a metal nitride film, and the second conductive material film is a metal film.

4. The method of manufacturing a semiconductor device according to claim 1, wherein the first conductive material film is a tungsten nitride film, and the second conductive material film is a titanium film.

5. The method of manufacturing a semiconductor device according to claim 1, wherein the reducing reaction is carried out by a heat treatment.

6. The method of manufacturing a semiconductor device according to claim 5, wherein the heat treatment is carried out at 450 to 600° C. under an inert gas atmosphere.

7. The method of manufacturing a semiconductor device according to claim 1, wherein the first gate electrode is formed by patterning the first conductive material film positioned on the gate insulating film under an unreduced state, and the second gate electrode is formed by patterning the third conductive material film and a fourth conductive material film converted from the second conductive material film by the reducing reaction.

8. The method of manufacturing a semiconductor device according to claim 1, wherein the second gate electrode is formed by patterning the third conductive material film after removal of the fourth conductive material film converted from the second conductive material film by the reducing reaction.

9. The method of manufacturing a semiconductor device according to claim 1, wherein the first and second gate electrodes are formed by forming a fifth conductive material film on the first conductive material film and the third conductive material film after removal of the fourth conductive material film on the third conductive material film, the fourth conductive material film being converted from the second conductive material film by the reducing reaction, and by patterning these conductive material films.

10. A method of manufacturing a semiconductor device, comprising:

forming a first conductive material film on a semiconductor substrate with a gate insulating film interposed therebetween;

selectively forming a reaction inhibiting layer on the first conductive material film;

forming a second conductive material layer on the first conductive material film including the reaction inhibiting layer, the second conductive material film being capable of reducing the first conductive film;

causing that portion of the first conductive material film which is in direct contact with the second conductive material film to be subjected to a reducing reaction with the second conductive material film so as to change the composition of the resultant film and to form a third conductive material film differing in the work function from the first conductive material film; and forming a first gate electrode having at least the first conductive material film and a second gate electrode having at least the third conductive material film and differing from the first gate electrode in the work function.

11. The method of manufacturing a semiconductor device according to claim 10, wherein the gate insulating film is formed of a metal oxide film or a silicate film.

12. The method of manufacturing a semiconductor device according to claim 10, wherein the first conductive material film is a metal nitride film, and the second conductive material film is a metal film.

13. The method of manufacturing a semiconductor device according to claim 10, wherein the first conductive material film is a tungsten nitride film, and the second conductive material film is a titanium film.

14. The method of manufacturing a semiconductor device according to claim 10, wherein the reaction inhibiting layer is a layer containing carbon.

15. The method of manufacturing a semiconductor device according to claim 10, wherein the reducing reaction is carried out by a heat treatment.

16. The method of manufacturing a semiconductor device according to claim 15, wherein the heat treatment is carried out at 450 to 600° C. under an inert gas atmosphere.

17. The method of manufacturing a semiconductor device according to claim 10, wherein the first gate electrode is formed by patterning the first conductive material film positioned on the gate insulating film under an unreduced state, the reaction inhibiting layer and the second conductive film, and the second gate electrode is formed by patterning the third conductive material film and a fourth conductive material film converted from the second conductive material film by the reducing reaction.

18. The method of manufacturing a semiconductor device according to claim 10, wherein the first gate electrode is formed by patterning the first conductive material film after removal of the reaction inhibiting layer and the second conductive material film formed on the reaction inhibiting layer, and the second gate electrode is formed by patterning the third conductive material film after removal of the fourth conductive material film converted from the second conductive material film by the reducing reaction.

19. The method of manufacturing a semiconductor device according to claim 10, wherein the first and second gate electrodes are formed by forming a fifth conductive material film on the first conductive material film and the third conductive material film after removal of the reaction inhibiting layer and the second conductive material film formed on the first conductive material film and the fourth conductive material film on the third conductive material film, the fourth conductive material film being converted from the second conductive material film by the reducing reaction, and by patterning these conductive material films.

* * * * *